United States Patent [19]

Mouissie

[11] 4,054,347

[45] Oct. 18, 1977

[54] CONTACT ASSEMBLY

[75] Inventor: Bob Mouissie, Berlicum, Netherlands

[73] Assignee: E. I. Du Pont de Nemours and Company, Wilmington, Del.

[21] Appl. No.: 686,940

[22] Filed: May 17, 1976

[30] Foreign Application Priority Data

May 21, 1975 Netherlands ............... 7505939

[51] Int. Cl.² ............... H01R 13/62; H05R 1/08
[52] U.S. Cl. ............... 339/75 M; 339/17 CF; 339/176 MP
[58] Field of Search .......... 339/17 CF, 75 M, 75 MP, 339/176 M, 91 R

[56] References Cited

U.S. PATENT DOCUMENTS

| 3,763,459 | 10/1973 | Millis ............... 339/75 M |
| 3,820,054 | 6/1974 | Clewes et al. ............... 339/75 M X |

OTHER PUBLICATIONS

Ecker, M. E., Zero Insertion Force Receptacle for a Planar Circuit Board, IBM Technical Disclosure Bulletin, vol. 17, No. 1, June, 1979.

Primary Examiner—Roy Lake
Assistant Examiner—E. F. Desmond

[57] ABSTRACT

A contact assembly is provided comprising a plastic housing including a pair of spaced rows of terminal receiving cavities and a contact in each cavity. Each cavity has a flexible wall, and a link having one end connected to the flexible wall and the other end engaged with a drive operatively mounted between the spaced rows. The drive extends each link, flexes the wall and engages a male terminal inserted in each cavity with the contact in each cavity to establish an electrical connection between the terminal and the contact.

6 Claims, 6 Drawing Figures

CONTACT ASSEMBLY

BACKGROUND OF THE INVENTION

1. Field of the Invention

The present invention relates to a contact assembly for receiving a plurality of male terminals of a modular circuit package, and particularly relates to such a contact assembly for receiving the male terminals of such a package without exerting any contact force on the terminals until the terminals are fully inserted in the contact assembly.

2. Description of the Prior Art

Contact assemblies for receiving a plurality of male terminals without exerting any contact force on the terminals until the terminals are fully inserted in a contact assembly are generally known as zero insertion force assemblies and are well known in the electronic packaging arts. Such contact assemblies are described in U.S. Pat. Nos. 3,541,490 and 3,750,086. In both of these patents a cam is used to flex a contact into engagement with a male terminal inserted in the contact assembly with zero insertion force. Contact assemblies for receiving a plurality of male terminals of a modular circuit package, e.g. a dual in-line integrated circuit package, are described in U.S. Pat. Nos. 3,683,317 and 3,883,207. In both of these patents, the contacts are flexed to engage a male terminal inserted in the contact assemblies.

SUMMARY OF THE INVENTION

According to the present invention, a contact assembly is provided for receiving a plurality of male terminals of a modular circuit package. The contact assembly comprises a plastic housing including a pair of spaced rows of terminal receiving cavities and a contact mounted in each cavity. Each cavity includes a resilient, flexible wall, a link connected between the flexible wall and a drive mechanism for extending the link, flexing the wall and engaging a male terminal inserted in the cavity with the contact mounted therein to establish an electrical connection between the male terminal and the contact in each cavity.

The contact assembly of the present invention provides for zero insertion force of the male terminals of the modular circuit package by deflecting the male terminals after they have been received in the terminal receiving cavities without any insertion force.

DESCRIPTION OF PREFERRED EMBODIMENTS OF THE INVENTION

Preferred embodiments of a contact assembly according to the invention are described below with reference to the attached drawings wherein the same numerals are used throughout the various views to illustrate the same elements.

Figure 1:
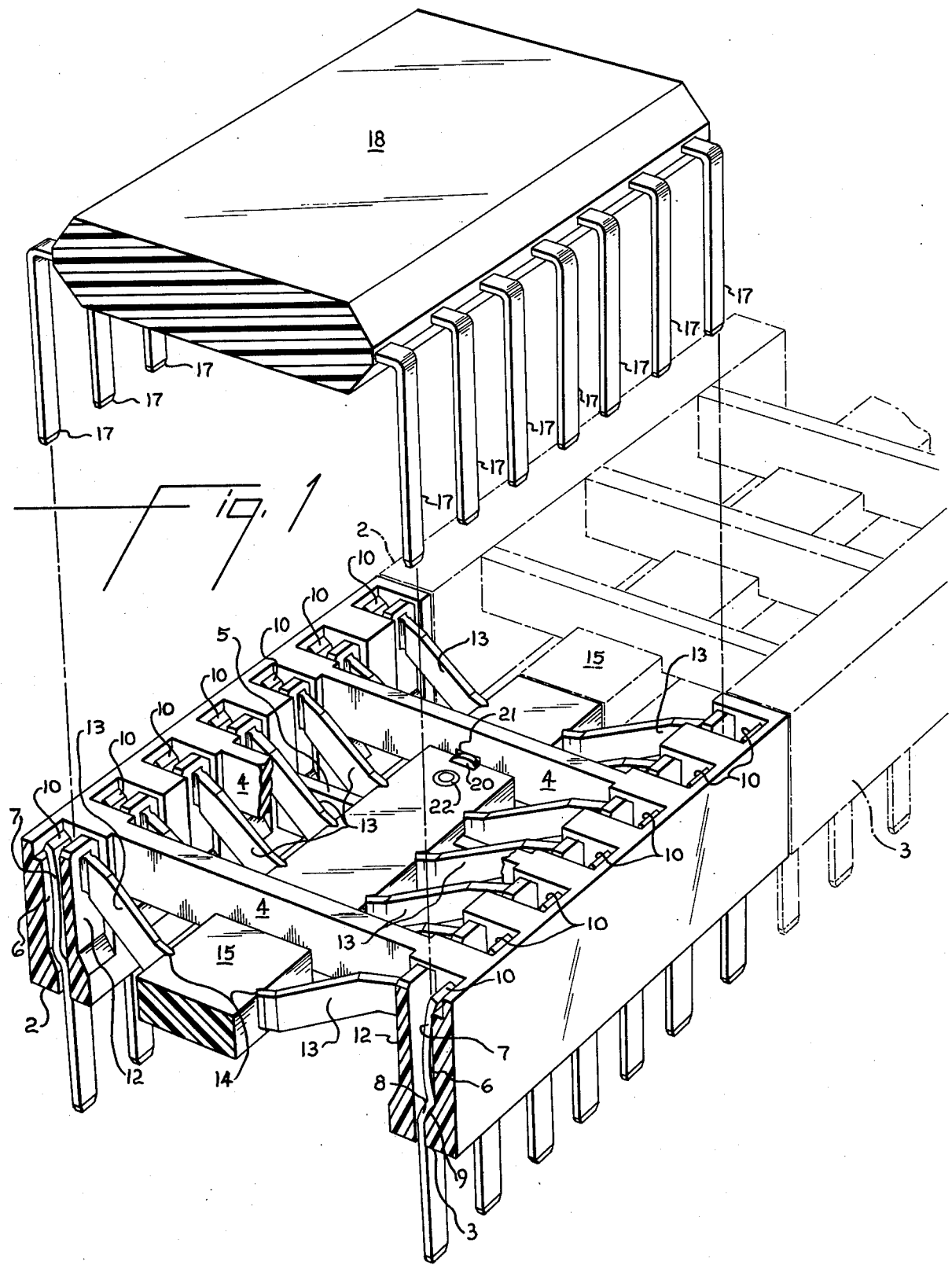
FIG. 1 is a perspective view of an embodiment of a contact assembly according to the invention and a modular circuit package.
Figure 2:
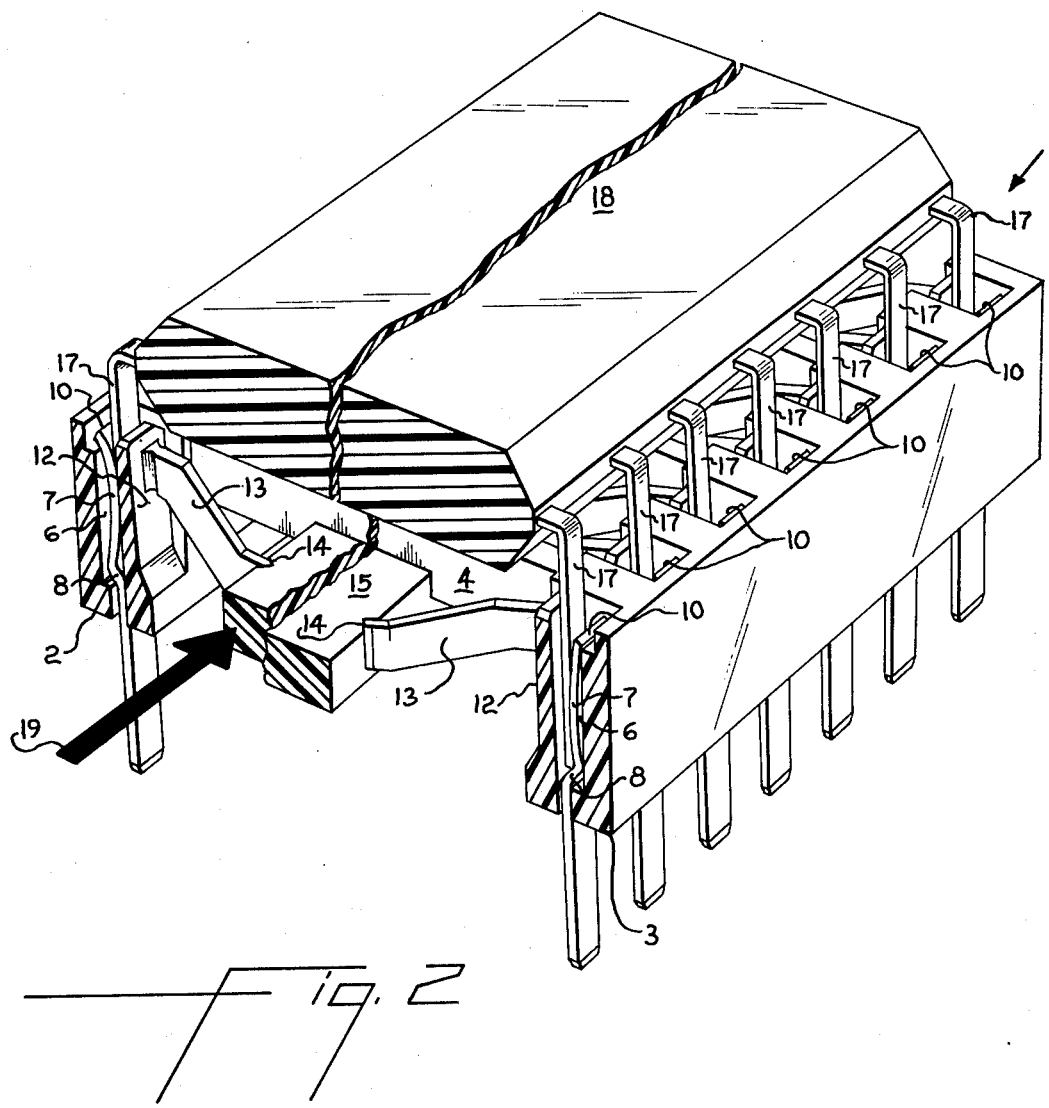
FIG. 2 is a perspective drawing similar to FIG. 1 illustrating a package inserted in the contact assembly.

A first embodiment of the contact assembly according to the invention is illustrated in FIGS. 1 and 2. The contact assembly comprises a plastic housing 1 including two spaced parallel rows 2, 3 which are connected to each other by alternatively disposed upper and lower horizontal ribs 4, 5. One of the upper ribs 4 has been fragmented to illustrate the lower rib 5.

Each row 2, 3 comprises a plurality of terminal receiving cavities 6. A contact 7 is mounted in each cavity 6 and includes a shoulder 8 which engages with a ledge 9 at the bottom of each cavity 6 and includes a leg which extends from a slot 11 in the bottom of each cavity 6. Each contact 7 is bowed along its length within the cavity and includes a lip 10 which engages a recess in an upper stationary wall of the cavity 6. Each cavity 6 includes a resilient, flexible wall 12 joined at its base to the housing 1. A link 13 is hingedly connected to an exterior side of each flexible wall 12 of each cavity 6. An end of each link 13 extends inwardly from the spaced rows 2, 3. A drive comprising a longitudinal slide 15 is operatively disposed between the upper and lower ribs 4, 5 and rows 2, 3. The slide 15 includes a plurality of notched recesses 14 for receiving an end of each link 13. The slide 15 includes a locking cam 20 which can be engaged through a recess 21 into one of the ribs 4. A stop 22 (one illustrated) is provided on the slide 15 on either side of the rib 4 to limit the longitudinal movement of the slide 15.

Figure 6:
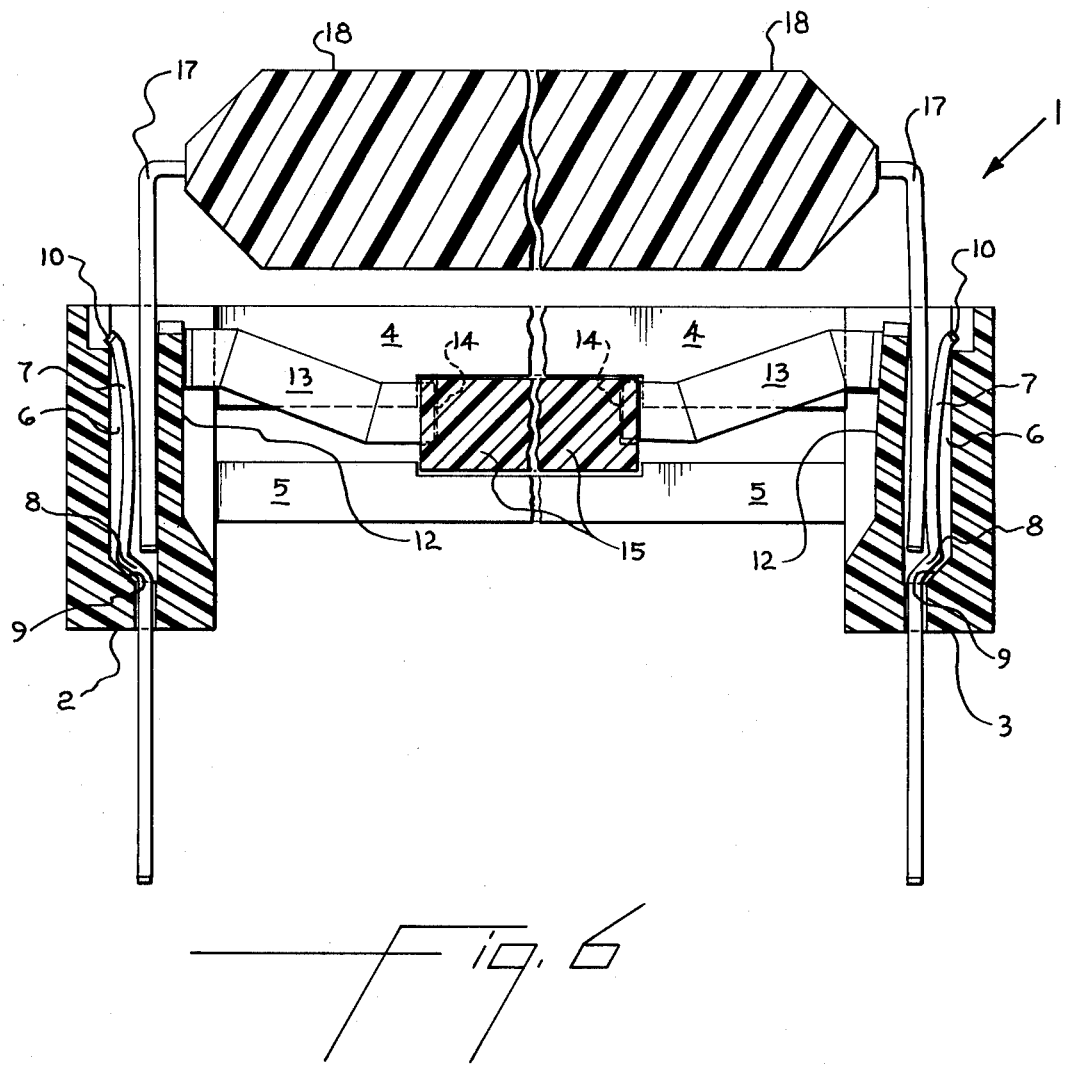
FIG. 6 is a front elevation view in section of the embodiment of FIGS. 2 and 3.

The operation of this embodiment of the contact assembly of the invention may be readily understood with reference to FIGS. 2 and 6 and the description which follows.

A modular package 18, e.g. a dual in-line integrated electronic circuit, having a plurality of male terminals 17 is inserted in the contact assembly with each terminal being received in a cavity 6 with zero insertion force. The slide 15 is illustrated in the loading position in the right side of the fragmented view in FIG. 2. The slide 15 is then shifted longitudinally in the direction indicated by arrow 19, as illustrated in the lefthand side of the fragmented view in FIG. 2. Each link 13 is fully extended and flexes wall 12 of each cavity 6 to engage a male terminal 17 in the cavity 6. The terminal 17 is deflected and engaged with the bowed segment of contact 7 in the cavity to establish an electrical connection between the terminal 17 and contact 7.

Figure 3:
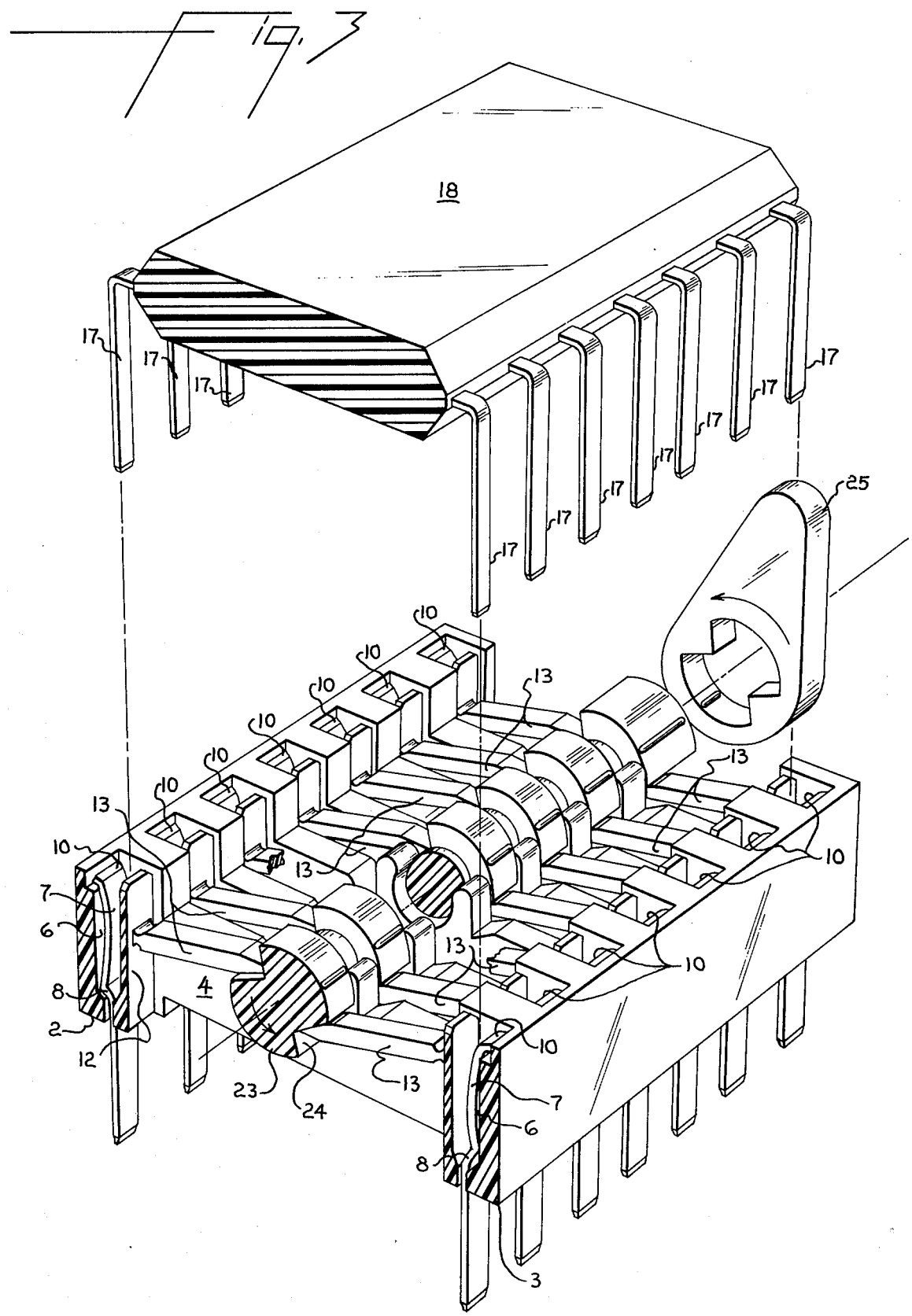
FIG. 3 is a perspective view of another embodiment of a contact assembly according to the invention and a modular circuit package.
Figure 4:
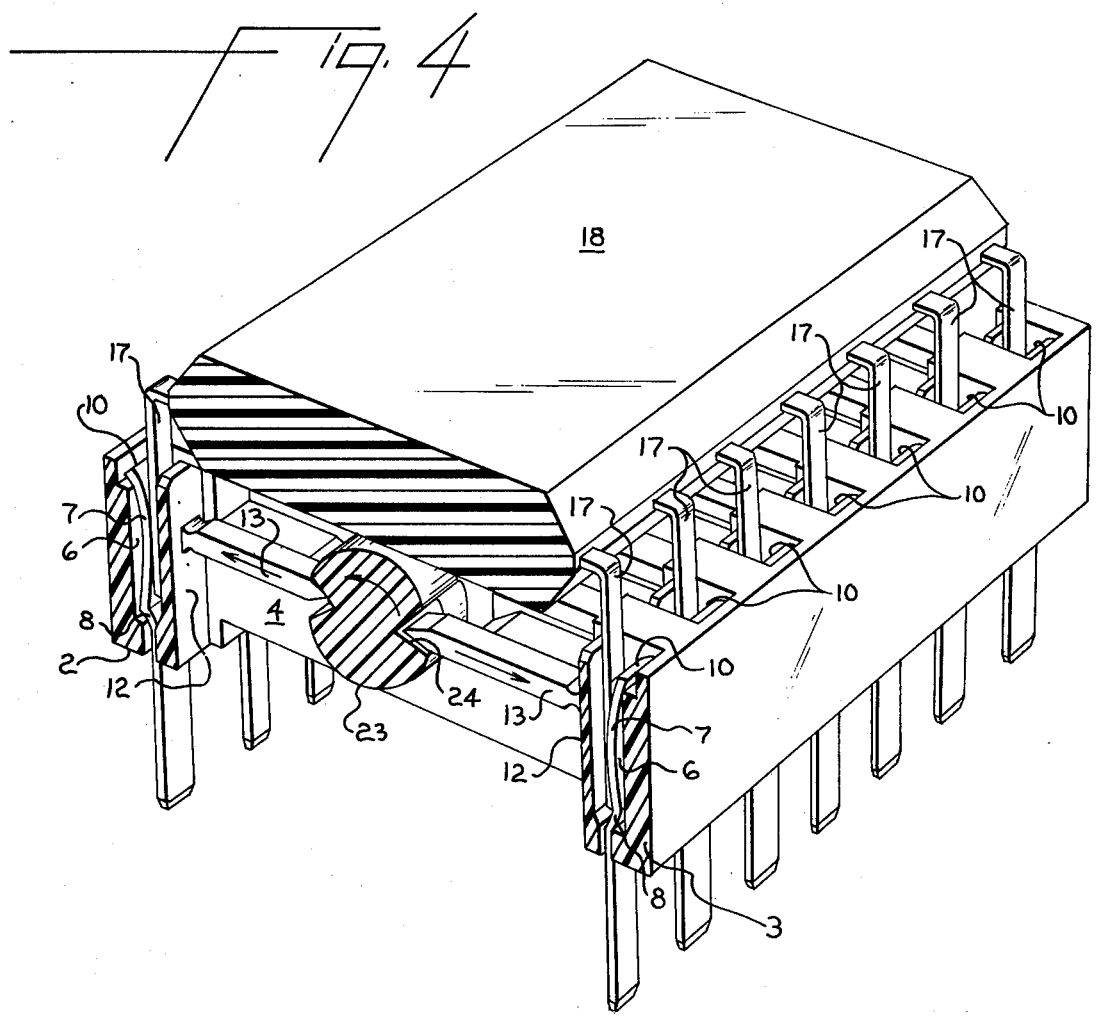
FIG. 4 is a perspective view similar to FIG. 3 illustrating a package inserted in the contact assembly of FIG. 3.
Figure 5:
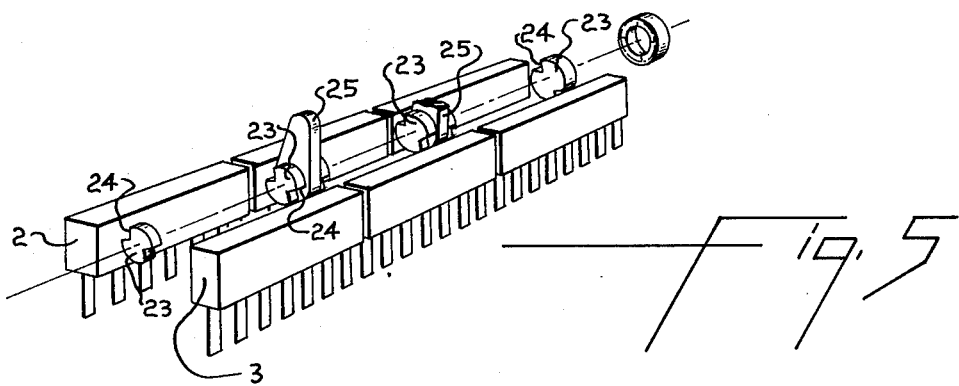
FIG. 5 is a schematic perspective view of a plurality of the contact assemblies of FIG. 4 arranged serially.

An alternative embodiment of a contact assembly according to the invention is illustrated in FIGS. 3-5. In this embodiment, a rotatable drive 23 is substituted for the longitudinal slide 15 and the links 13 are hinged in a horizontal configuration with respect to the flexible wall 12 of each cavity 6. The rotatable member 23 includes a plurality of notched recesses 24 for receiving an end of each link 13. A handle 25 is provided for rotating the member 23 to extend each link 13 and flex wall 12, similar to the embodiment of the contact assembly illustrated in FIGS. 1 and 2 and described above.

The contact assemblies of the present invention may be mounted on a printed circuit board by inserting the legs of contact 7 in holes in the circuit board and soldering the legs using conventional soldering processes, for example, wave or dip soldering.

A plurality of the contact assemblies may be mounted and operated serially, as illustrated in phamton in FIG. 1 or as illustrated in FIG. 5.

What is claimed is

1. In a contact assembly comprising a plastic housing including a pair of spaced rows of terminal receiving cavities and a contact mounted in each cavity for receiving a male terminal of a modular circuit package, each cavity having a flexible wall and a link having one end connected to the flexible wall and the other end engaged with a drive operatively mounted between the spaced rows of terminal receiving cavities for extending each link, flexing the wall and engaging a male terminal inserted in each cavity with the contact in each cavity to establish an electrical connection between the terminal and the contact.

2. A contact assembly, as recited in claim 1, said drive comprising a longitudinal slide.

3. A contact assembly, as recited in claim 1, said drive comprising a rotatable member.

4. A contact assembly, as recited in claim 1, each flexible wall being joined at a base to the housing.

5. A contact assembly, as recited in claim 4, each flexible wall and link being integrally molded with said housing and including a hinge connecting each line to each wall.

6. A contact assembly, as recited in claim 1, said drive including a notch for receiving an end of each link.

* * * * *